United States Patent [19]

Anderson et al.

[11] Patent Number: 4,952,867
[45] Date of Patent: Aug. 28, 1990

[54] BASE BIAS CURRENT COMPENSATOR

[75] Inventors: James R. Anderson, Chicago; Richard Brander, Cicero, both of Ill.

[73] Assignee: Beltone Electronics Corporation, Chicago, Ill.

[21] Appl. No.: 343,872

[22] Filed: Apr. 27, 1989

Related U.S. Application Data

[62] Division of Ser. No. 269,618, Nov. 10, 1988, Pat. No. 4,876,499, which is a division of Ser. No. 202,664, Jun. 6, 1988, Pat. No. 4,829,270, which is a division of Ser. No. 838,924, Mar. 12, 1986, Pat. No. 4,792,977.

[51] Int. Cl.$^5$ ............................................. G05F 3/26
[52] U.S. Cl. .................................... 323/273; 323/315; 330/288
[58] Field of Search ............... 323/273, 280, 315, 316; 307/270; 330/288

[56] References Cited

U.S. PATENT DOCUMENTS

| | | | |
|---|---|---|---|
| 3,927,279 | 12/1975 | Nakamura | 381/68.2 |
| 4,099,035 | 7/1978 | Yanick | 381/68.2 |
| 4,119,814 | 10/1978 | Harless | 381/68.2 |
| 4,262,244 | 4/1981 | Price | 323/316 |
| 4,354,064 | 10/1982 | Scott | 381/68.2 |
| 4,366,349 | 12/1982 | Adelman | 381/68.2 |
| 4,405,831 | 9/1983 | Michelson | 381/68.4 |
| 4,409,435 | 10/1983 | Ono | 381/68.2 |
| 4,484,345 | 11/1984 | Stearns | 381/68.2 |
| 4,490,691 | 12/1984 | Dolby | 381/106 |
| 4,508,940 | 4/1985 | Steeger | 381/68.2 |
| 4,517,415 | 5/1985 | Laurence | 381/68.4 |
| 4,525,683 | 6/1985 | Jason | 330/288 |
| 4,535,471 | 8/1985 | Kuroda | 381/106 |
| 4,596,902 | 6/1986 | Gilman | 381/68.2 |
| 4,630,305 | 12/1986 | Borth | 381/68.2 |

FOREIGN PATENT DOCUMENTS

| | | | |
|---|---|---|---|
| 245279 | 4/1987 | Fed. Rep. of Germany | |
| 102004 | 6/1985 | Japan | 330/288 |
| 2143692 | 2/1985 | United Kingdom | 330/288 |

OTHER PUBLICATIONS

Data Sheet, entitled "Dual Linear-Antilog Voltage Controlled Amplifier", by Solid State Micro Technology for Music, Inc. (1 page).
Article entitled "Coming To Terms With Hearing Aid Technology", by Preben Brunved, published in The Hearing Journal, Jun., 1985 (5 pages).
Data Sheet, entitled "Dual Continuous Analog High Pass Filter", by LTI, bearing designation 500-73-1 (4 pages).

Primary Examiner—William H. Beha, Jr.
Attorney, Agent, or Firm—Allegretti & Witcoff, Ltd.

[57] ABSTRACT

A bias current compensator to supply the input bias current of a transistor. The bias current compensator may be used, for example, with the controlled amplifiers used in an automatic gain control system. The bias current compensator prevents bias current changes, caused by a varying control signal, from appearing in the output of the controlled amplifier. The bias current compensator includes a current source, first, second, and third transistors, and a feedback amplifier.

4 Claims, 16 Drawing Sheets

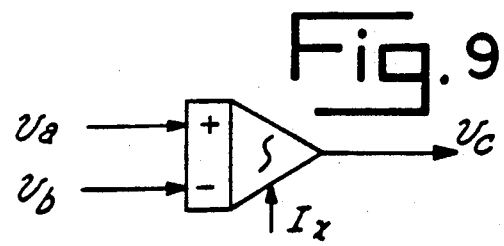
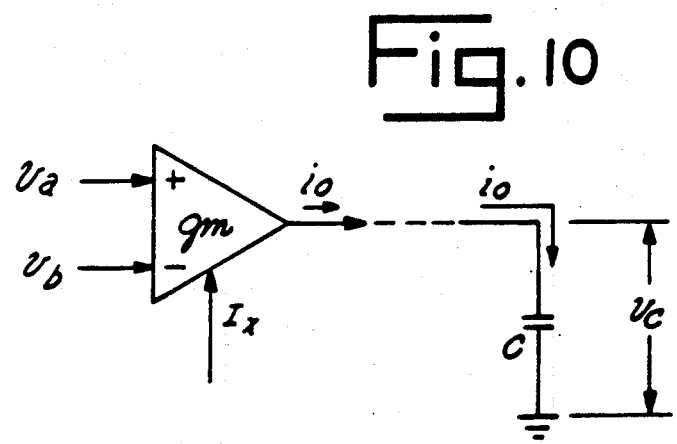
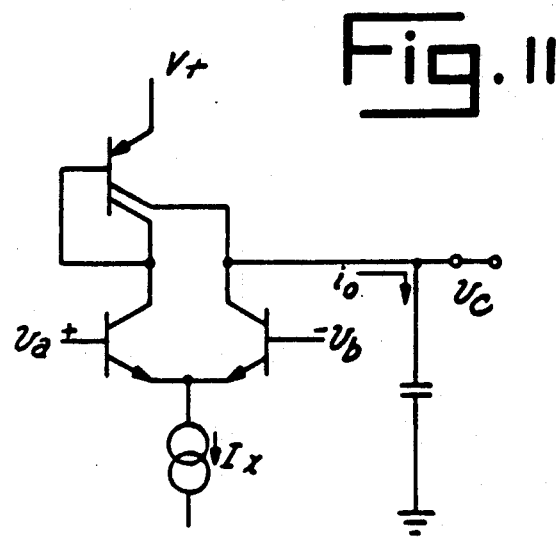

507, 509 MAY BE PARRELLEL-CONNECTED TRANSISTORS

BASE BIAS CURRENT COMPENSATOR

This is a division of application Ser. No. 269,618 filed Nov. 10, 1988 now U.S. Pat. No. 4,876,499. Application Ser. No. 269,618 is a division of application Ser. No. 202,664 filed June 6, 1988, now U.S. Pat. No. 4,829,270, which is a division of application Ser. No. 838,924 filed Mar. 12, 1986, now U.S. Pat. No. 4,792,977.

BACKGROUND OF THE INVENTION

The present invention relates generally to hearing aids, and more particularly, to circuits that more compactly, economically, and effectively present a modified and amplified sound for the wearer of a hearing aid. In its most basic form, a hearing aid is a device which receives a sound signal and furnishes a modified sound signal to the wearer of the hearing aid, so that the wearer may hear better.

Hearing impaired persons differ considerably in the degree and pattern of their hearing loss. This is reflected in their audiograms.

An audiogram is a chart of hearing threshold level (HTL) versus frequency. The HTL is measured on a logarithmic (decibel) scale and compares an individual's threshold of detection of a tone to that of normal hearing persons.

Audiograms can differ in level from near normal (0 dB HTL) to profound loss (greater than 100 dB HTL). They can vary in pattern from a flat audiogram (approximately equal HTL over the relevant frequency range) to a sharply falling audiogram (HTL increasing at a more than 30 dB per octave of frequency increase) or to a rising audiogram (HTL decreasing with frequency). Within the category of sharply falling audiograms, the frequency at which the audiogram begins to fall can vary greatly between individuals.

Patterns of hearing loss can also differ considerably in the relationship between the subjectively experienced loudness and the input sound pressure level. Not only are there wide differences in the lowest level that the ear can perceive (the HTL), there are also wide differences in the highest level that the ear can tolerate (the loudness discomfort level or LDL) and differences in the rate of growth of loudness between these two extremes. In some cases, a much higher than normal HTL is combined with a lower than normal LDLm giving a much reduced dynamic range of usable sound levels.

Because of the large differences in degree and pattern of hearing loss, there is also a wide range of hearing aid characteristics required to optimally assist hearing impaired persons. The frequency response of the hearing aid must be selected for the individual hearing loss and may require high order filtering with selection of frequency bandwidth as well as general shape within that bandwidth. The gain of the hearing aid must be selected in accordance with the degree of the hearing loss.

The limiting level of the hearing aid must be selected in accordance with the LDL. A selection of the type of output limiting must be made between peak clipping, or output Automatic Gain Control ("AGC"). Output AGC is an automatic gain control system whose action is related to the output level of the hearing aid. This relation is substantially independent of the setting of the user operated volume control.

If the ear has a much reduced dynamic range, an input AGC system may be needed. Input AGC is an automatic gain control system whose action is related to the input level to the hearing aid. The relation between the action of the input AGC and the input level is also substantially independent of the setting of the user-operated volume control. In the case of an input AGC, a selection must be made of the compression threshold, (the input level at which AGC action begins), and the compression ratio, (the ratio of the decibel change in input to the decibel change in output level).

It is desirable that a single hearing aid be provided with a range of adjustability in these various characteristics. This is important not only because it allows a single hearing aid model to be used for many persons with differing hearing losses, but also because it allows the hearing aid to be readjusted if the initial selection of hearing aid characteristics was incorrect or if the user's hearing loss changes with time.

Because hearing aids are normally worn on the head, they must be small and usually operate with a small, single cell battery for extended periods of time. They must also provide good performance, be highly reliable, and be low in cost. The electronic circuits used to provide the various functions of a hearing aid must also have these same characteristics. Of course, such circuits will also be useful in applications other than hearing aids but having similar requirements.

Prior hearing aids have had limitations in meeting the needs described above. They have been limited in the degree of filtering provided to control the frequency response. When equipped with an input AGC system, they have not provided a well-defined compression threshold and a well defined compression ratio. Also, they have not provided the needed degree of adjustability in either their frequency response characteristics or in their output level versus input level and AGC characteristics.

Prior electronic circuits also have had limitations in meeting the needs described above. Circuits that are small in size and that can operate with a low supply voltage of about 1.3 volts and that draw little supply current have not provided good performance and have not provided the desired adjustment characteristics. Prior electronic circuits that could meet the performance needs described above have required higher supply voltage and current, have required many components, have been large in size, or have not been in a form in which they could be adjusted by operation of a single control.

The subsystems, or specific circuits, which help achieve the general objectives for hearing aids have their own specialized goals. Such specific goals are discussed in more detail below.

SPECIFIC SUBSYSTEMS

Output Limiting

In many electronic systems, such as hearing aids, the output signal level must not increase indefinitely, but must be limited in some manner. Two techniques have been used for this purpose: peak clipping and output AGC limiting. In either case, it is often useful to have an adjustable limiting level.

In many circumstances, a peak clipper should limit the maximum output signal level to a limiting level selected by adjustment of a power level control. At the same time, the peak clipper should substantially maintain a constant gain as the power level control is adjusted for signal levels below the limiting level.

The clipper should clip both positive and negative excursions of the waveform symmetrically. It should also have an easily adjustable clipping level. It is also desirable that adjusting the clipping level should not change the frequency response for input signal levels below or well above the clipping level.

For many hearing aids with single-ended Class A output stages, the clipping level is adjusted by a variable resistor in series with the receiver. This arrangement does not produce symmetrical clipping. It also results in a hearing aid gain that changes with clipping level and a frequency response that changes with clipping level.

For many hearing aids with push-pull Class AB output stages, the clipping level is adjusted by a variable resistor in series with the center tap of a receiver. This produces symmetrical clipping, but still results in a frequency response for high input signal levels that varies with the clipping level. Another problem with this arrangement is that the clipping level for a high variable resistor setting is very sensitive to the output stage bias current; this occurs since the voltage drop across the resistor produced by the bias current will subtract a substantial portion of the total output voltage range which varies with bias current.

In an output stage that drives an inductive load to saturation, such as the output stage of a hearing aid driving a magnetic receiver, the voltage at the output can swing below the lowest supply voltage. Often, for compact size, the output stage is included in a monolithic integrated circuit. In such an integrated circuit, the substrate is connected to the lowest supply voltage, and circuit elements on the integrated circuit are isolated from each other by reverse biased diode junctions between these elements and the substrate. If the voltage on an element swings below the substrate voltage, the normally reverse-biased isolation becomes forward biased, compromising the isolation between circuit elements. What is needed is a compact, efficient circuit to prevent the voltage from swinging substantially below the substrate voltage.

In many cases it is advantageous to limit the output signal level of an electronic system by using an output AGC system. If the AGC system holds the output level below clipping level, much less signal distortion occurs when limiting. In many cases, it is desirable that the output AGC system limit the output signal level to a limiting level selected by adjustment of a power level control while maintaining a constant gain as the power level control is adjusted for signal levels below the limiting level. Also it is advantageous to be able to select either peak clipping or output AGC action by operating a single switch. Furthermore, it is often desirable that the limiting levels for both peak clipping and output AGC be adjusted by a single power level control with the output AGC limiting level being just sufficiently below the peak clipping level to maintain low distortion.

When an output stage is driving a load whose impedance varies substantially with frequency, such as a hearing aid receiver, there may be some frequency regions in which output stage saturation is caused by a limited available output voltage and other frequencies regions in which output stage saturation is caused by a limited available output voltage and other frequencies load, such as a hearing aid receiver, high current levels may cause the receiver itself to produce distortion. For these reasons it is advantageous to have an output AGC system which detects both output stage signal voltage and output stage signal current and combines these detected signals in such a way as to cause the output AGC system to limit the output signal to just sufficiently below these saturation levels to maintain low distortion.

SUMMARY OF THE INVENTION

In a principal aspect the present invention is an improved hearing aid.

A principal aspect of the present invention is an automatic gain control ("AGC") system for receiving an input signal and providing a compressed output signal and providing an adjustable compression threshold and an adjustable compression ratio. The AGC system includes a primary controlled amplifier, a secondary controlled amplifier, a threshold detector, a control circuit, a compression threshold control, and a compression ratio control.

The input signal is applied to the inputs of the primary controlled amplifier and the secondary controlled amplifier. The output of the secondary controlled amplifier is applied to the input of the threshold detector, which detects when the output signal from the secondary controlled amplifier exceeds a predetermined level. The output of the threshold detector is connected to a control circuit.

The control circuit combines the output of the threshold detector with a control signal from the compression threshold control and develops a secondary control signal which is applied to the control input of the secondary controlled amplifier. This forms a feedback system to reduce the gain of the secondary controlled amplifier when the signal level at the output of the secondary controlled amplifier exceeds the threshold level of the threshold detector. This, in turn, occurs at an input level to the secondary controlled amplifier that is established by the control signal from the compression threshold control.

The output of the threshold detector is also applied to the compression ratio control, which provides an adjustable portion of this output as a primary control signal to the control input of the primary controlled amplifier. The output of this amplifier is the compressed output signal from the AGC system.

According to another aspect, the present invention is a differential voltage threshold detector for sensing when the difference between the voltages applied to first and second input terminals exceeds a predetermined threshold. This detector, may be used, for example, in the AGC system just described. The detector includes a differential transconductance stage, first and second "top" current mirrors, first and second "bottom" current mirrors, and a detector.

The differential transconductance stage senses the difference in the voltages at the first and second terminals and issues first and second output currents. The first and second top current mirrors sense these outputs. In response, each top current mirror issues two mirrored signals. Each bottom mirror sense one of the top current mirror signals and responsively provides a bottom current mirror signal.

The detector is interconnected to both of the top and bottom current mirrors. The detector senses when the second current mirror signal from the first top mirror substantially exceeds the signal from the second bottom mirror or when the second signal from the second top mirror substantially exceeds the signal from the first bottom mirror. Such a detection occurs when the voltage applied to the two input terminals varies by more than a predetermined amount. Accordingly, the detector issues an output signal.

In another aspect, the present invention is a bias current compensator. See U.S. Pat. No. 4,425,551. This bias current compensator may be used, for example, with the controlled amplifiers used in the AGC system previously described. The bias current compensator prevents bias current changes, caused by a varying control signal, from appearing in the output of the controlled amplifier. The bias current compensator includes a current source, first, second, and third transistors, and a feedback amplifier.

The current source supplies a known multiple of a predetermined collector current in a reference transistor. The emitter of the first transistor is interconnected to the current source and receives the current. The output of the second transistor provides current to the base of the first transistor. The third transistor is interconnected to the second transistor so that the current in the second transistor bears a predetermined relation to the current in the third transistor.

The input to the feedback amplifier is connected to the emitter of the first transistor. The output of the feedback amplifier is connected to the inputs of the second and third transistors. By means of this feedback, the base current of the first transistor is controlled so that the emitter current of the first transistor substantially equals that of the input current source.

The output of the third transistor is interconnected to the base of the reference transistor. Thus, by controlling the reference current source, the current supplied by the third transistor to the base of the reference transistor is accurately controlled.

Another aspect of the present invention is a compansion system for increasing the dynamic range of a circuit element that has a limited dynamic range. This system includes a first controlled amplifier, second controlled amplifier, threshold detector, and inverse amplifier.

The first amplifier includes an input signal lead and a control lead. The first controlled amplifier receives the input signal and amplifies the signal according to the signal applied to the control lead. The threshold detector is interconnected to the output of this first amplifier and the input of the "circuit element." It detects when the output of the amplifier exceeds a predetermined level and thus would exceed the dynamic range of the circuit element. When this occurs, the threshold detector provides a control signal to the control lead of the first amplifier to thereby reduce the gain of the first amplifier thereby compressing the range of signal levels at its output.

The second controlled amplifier is interconnected to the output side of the circuit element. The second amplifier includes an input lead and a control lead as well. The second amplifier changes its gain in accordance with the control signal provided at its control lead.

The inverse amplifier is connected to the output lead of the threshold detector and receives the control signal that is received by the gain control lead of the first amplifier. The inverse amplifier, however, then inverts the signal and applies it to the control lead of the second controlled amplifier so that the increase in gain of the second controlled amplifier substantially equals the decrease in gain of the first controlled amplifier. The second controlled amplifier thus expands the range of signal levels at its output to substantially compensate for the compression of the range by the first controlled amplifier.

Another aspect of the present invention is a controlled current source for providing an output current substantially exponentially related to a difference between voltages on first and second input terminals and substantially linearly related to an input current applied to a third input terminal. The controlled current source includes first, second, and third transistors.

The controlled current source may be used, for example, to combine control signals from the AGC system and the compansion system described above. In this way, one controlled amplifier may be used instead of two. The first transistor is interconnected to the third input terminal to receive the input current and also is interconnected to the first input terminal to receive the voltage applied to it. The second transistor is interconnected to the first as a feedback stage to regulate the emitter voltage of the first and third transistors.

The third transistor is interconnected to the first transistor as well. The third transistor senses the voltage of the second input terminal and responsively provides an output current.

Another principal aspect of the present invention is a clipper circuit for limiting the predetermined maximum output of an amplifier. It includes first and second amplifiers. The first amplifier has a signal input interconnected to the input terminal and a feedback input interconnected to the output of the second amplifier. It responsively provides a first amplifier output signal.

The second amplifier is interconnected to the first amplifier and responsively provides an output signal. The second amplifier includes a control input and a variable current source. The maximum excursion of the second amplifier is limited by the current supplied to the control input.

The input to the second amplifier may conveniently be connected to a threshold detector to be used for an AGC system whose threshold is directly related to the adjustable clipping level.

In yet another aspect, the present invention is a voltage clamp to prevent a voltage at a node, and particularly a node in an integrated circuit, from becoming substantially negative with respect to a reference node, for example an integrated circuit substrate, and thus causing undesirable circuit operation. The clamp includes a reference voltage source, a voltage sensor, and a voltage supply.

The voltage sensor is interconnected to the node for providing variable conductivity between a voltage supply input and a sense input. The reference voltage source supplies a substantially constant reference voltage to a reference node. The voltage supply supplies the required current through the variable conductivity to the sense node.

GENERAL OBJECTS

A general object of the present invention is an improved hearing aid. Another object is a hearing aid with a wider range of control over its frequency responses. Still another object is a hearing aid with a wider range of control over its output level versus input level characteristics.

A further object of the present invention is a hearing aid with wider dynamic range, lower distortion and more consistent operation that will operate effectively on low supply voltage and is more compact, reliable, economical to use, and less expensive to manufacture.

SPECIFIC OBJECTS

Allows the compression ratio to be more independently adjustable by a single control;

Operates with lower voltage, lower current, is more compact; and

Is less expensive.

Still an additional object of the present invention is an improved threshold detector that:

More accurately determines low voltage thresholds; and

More effectively utilizes a differential input and is inherently a full wave detector.

An additional object is a bias current compensation circuit that operates on lower supply voltage and provides more accurate and reliable operation.

COMPANSION SYSTEM

Another object of the present invention is an improved compansion system that:

More effectively increases dynamic range of other circuit elements;

More effective uses a single threshold detector (or level detector) and detector filter;

Provides superior transient characteristics during attack and release;

Utilizes a low supply voltage and low supply current; and

Is more compact.

A further object is an improved voltage controlled, exponential current source that:

Allows gain controlling signals to be combined into a single composite control signal;

Reduces the number of variable gain amplifiers required; and

Provides a flexible controlled current source with both linear control input and exponential control input.

OUTPUT LIMITING

Still further objects of the present invention are as follows:

An improved adjustable peak clipper with more symmetrical clipping of positive and negative peaks;

A clipper that allows voltage gain to remain more substantially constant as the clipping level is adjusted;

A clipper whose clipping level is substantially independent of supply voltage;

A clipper providing a clipping level not based on junction voltage;

A clipper that provides an output signal with which a threshold detector may provide an AGC control signal which is related to clipping level;

A circuit that more easily allows for clipping and/or AGC level established before a fixed gain output stage to provide a constant frequency response as clipping level is adjusted; and A circuit that more easily allows the clipping and AGC systems to be used on different kinds of output stages.

Another object is an output stage with AGC detectors that more accurately detect both output voltage and output current so that maximum output may be limited by AGC to below the voltage and current levels which would produce distortion, either in the output stage or the load.

An additional object is an improved voltage clamp that prevents voltage swings (with an inductive load) from going substantially below the substrate voltage of an integrated circuit which would disturb operation.

These and other objects of the present invention will be more fully understood by reference to the following detailed description of the preferred embodiments.

BRIEF DESCRIPTION OF THE DRAWING

Preferred embodiments of the present invention are described herein with reference to the drawing wherein:

GENERAL CIRCUIT

Figure 1:
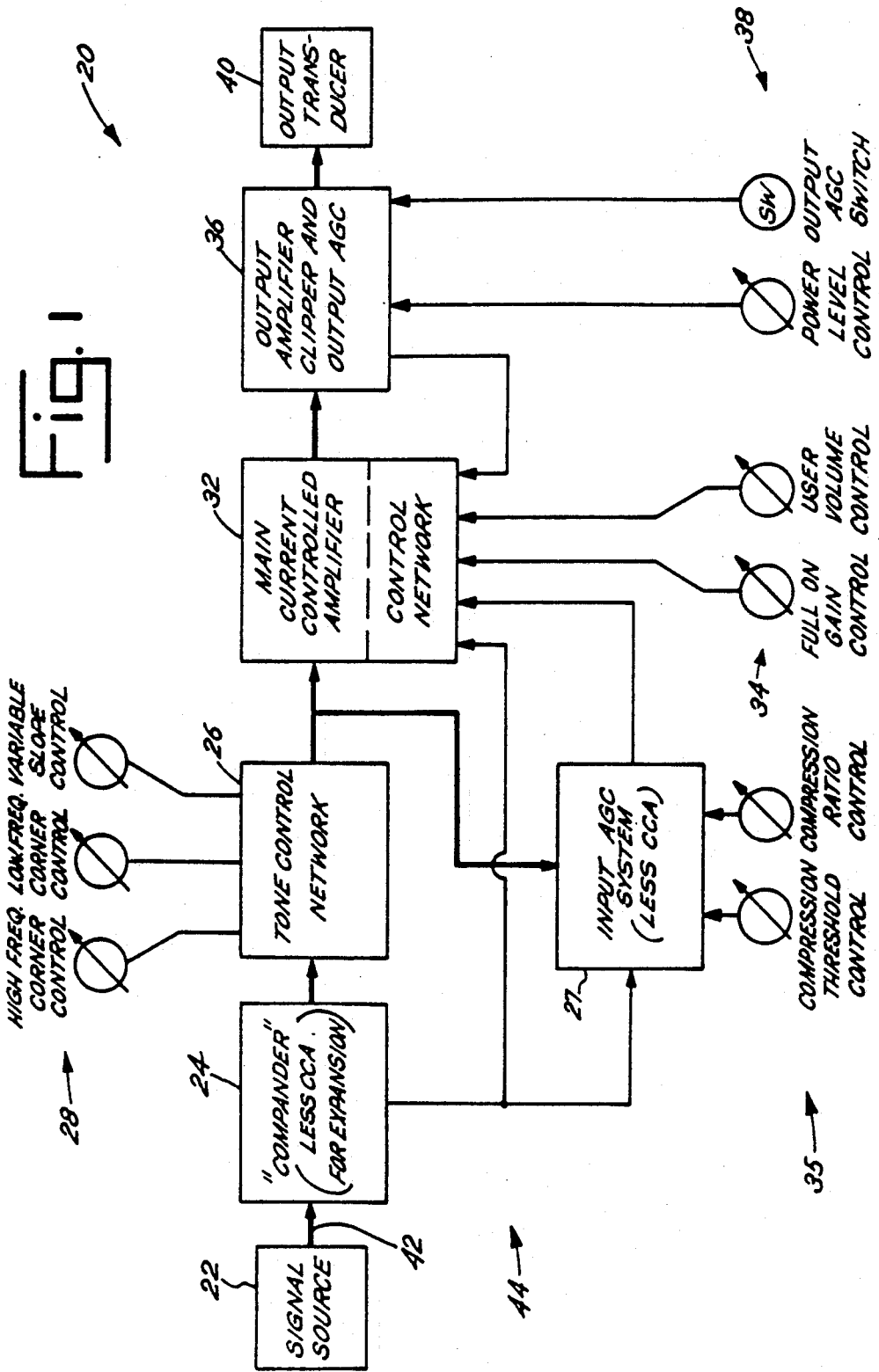
Figure 2:
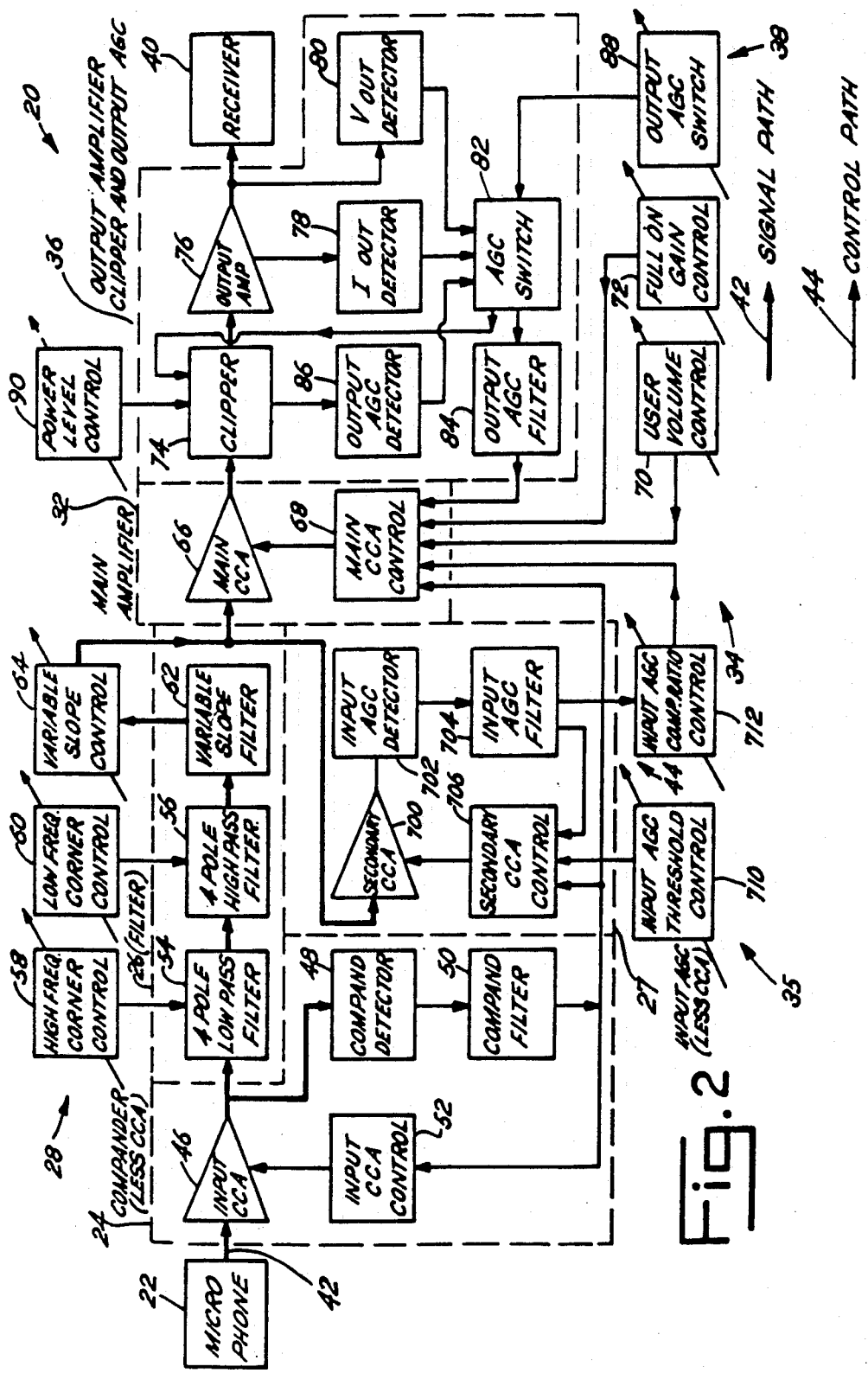

FIG. 1 is a block diagram of the preferred embodiment of the hearing aid of the present invention;

FIG. 2 is a more detailed block diagram of the preferred embodiment of the hearing aid shown in FIG. 1;

SUB-SYSTEMS

Figure 3:
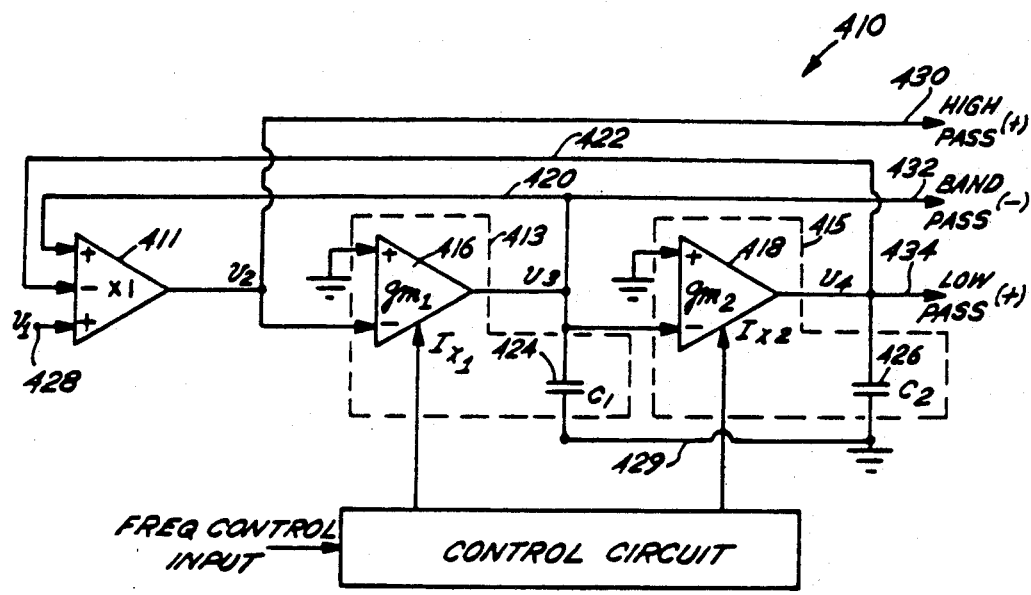
Figure 4:
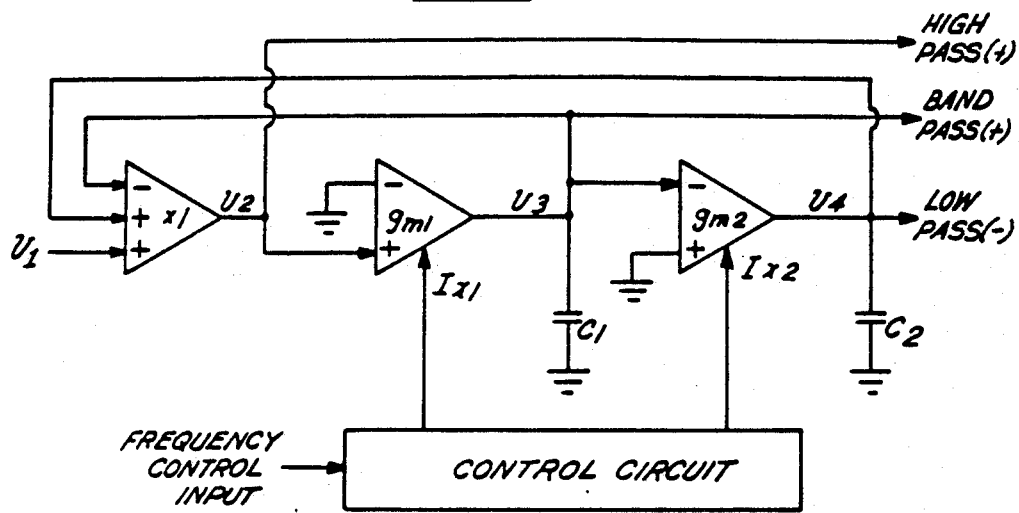
Figure 5:
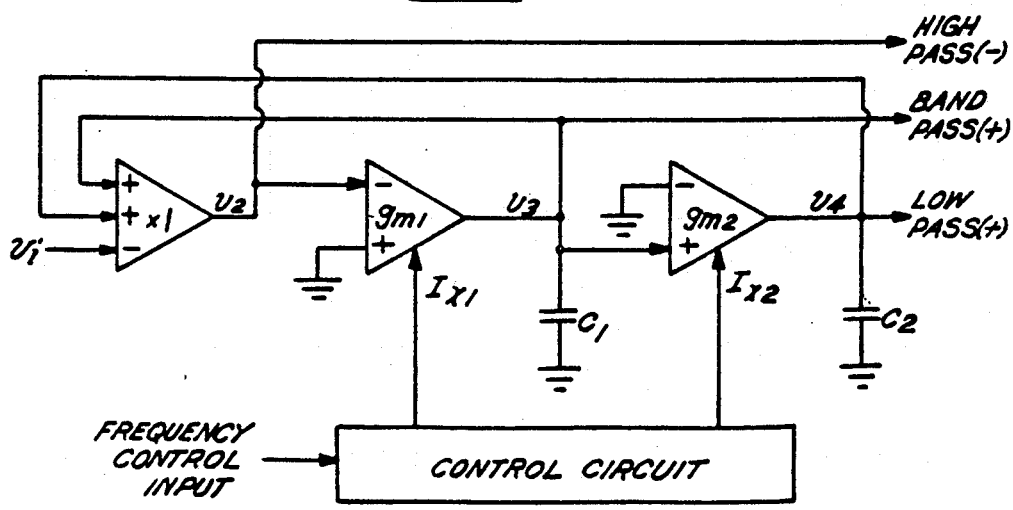
Figure 6:
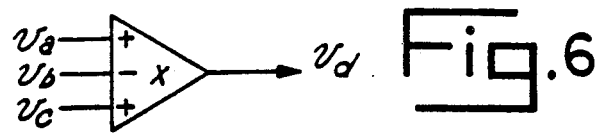
Figure 7:
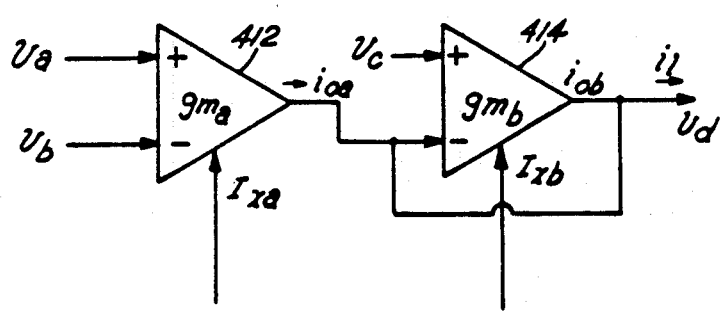
Figure 8:
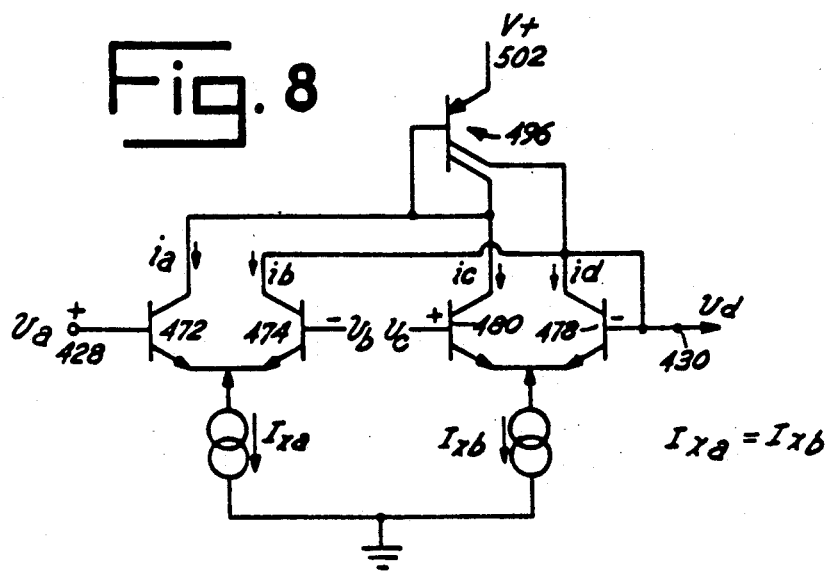
Figure 12:
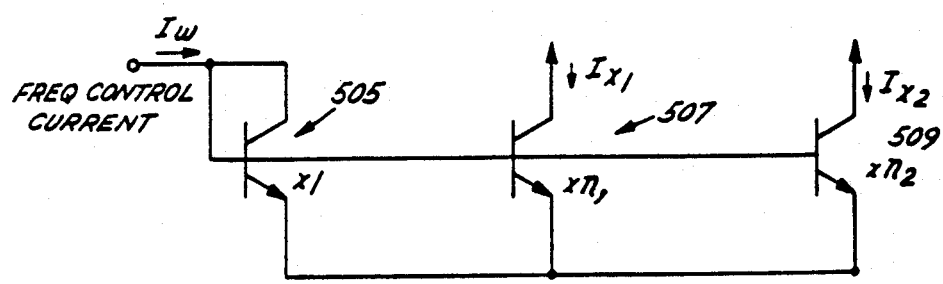
Figure 12A:
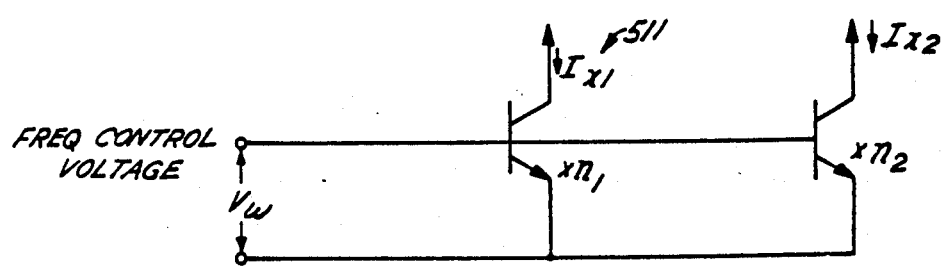
Figure 13:
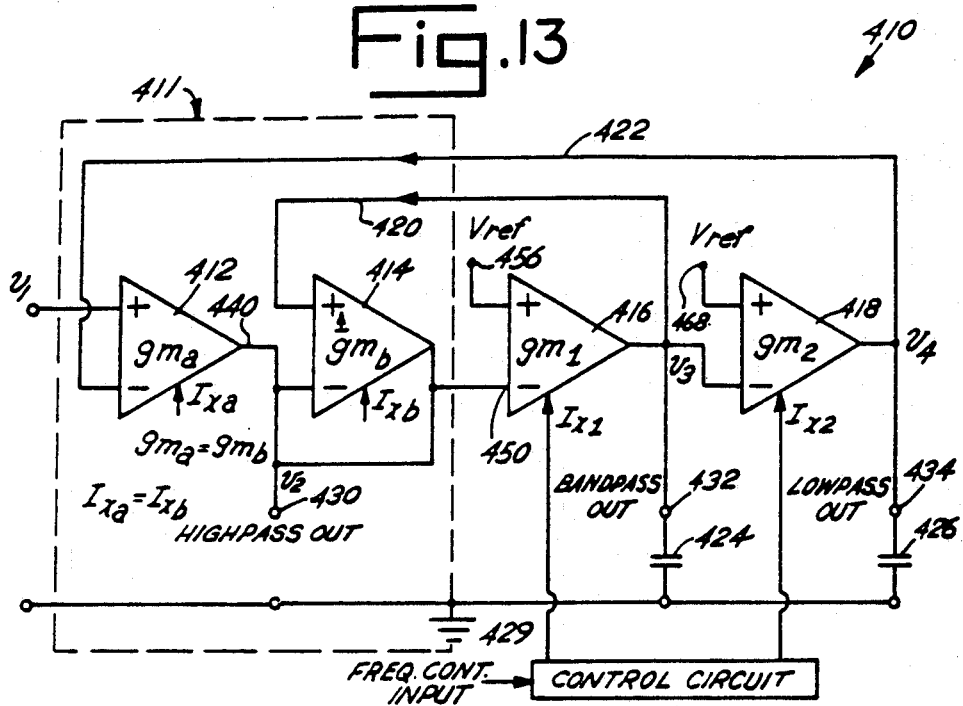
Figure 14:
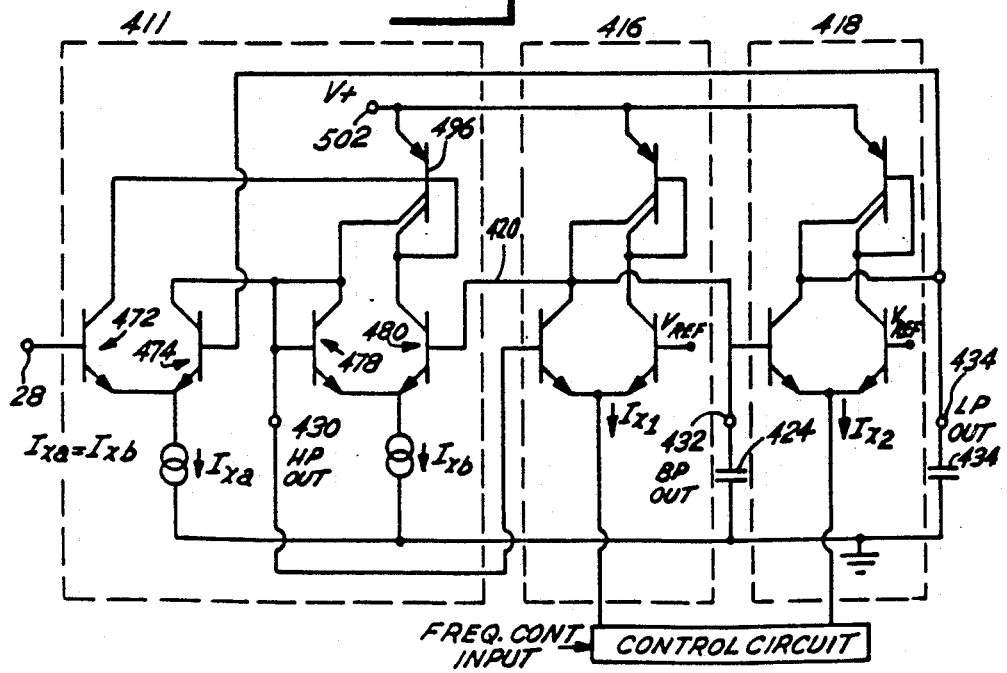
Figure 15:
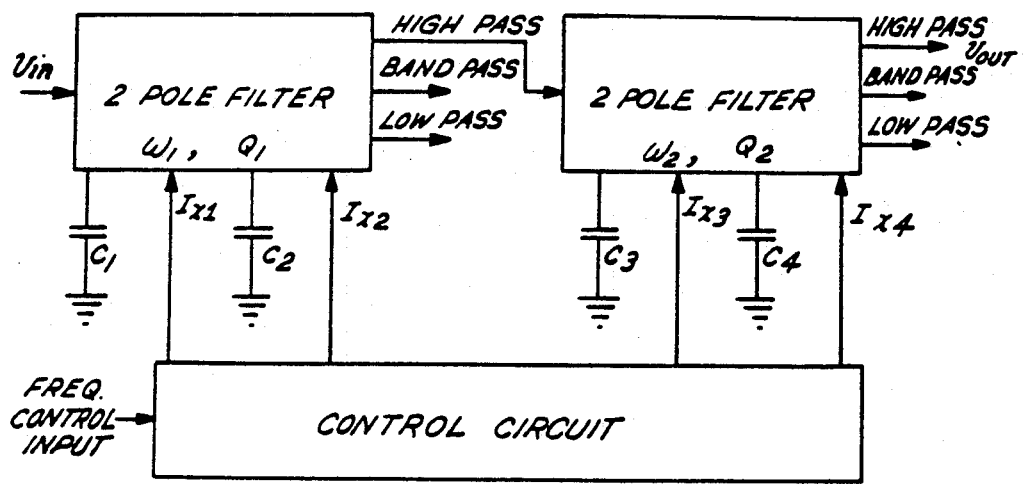
Figure 16:
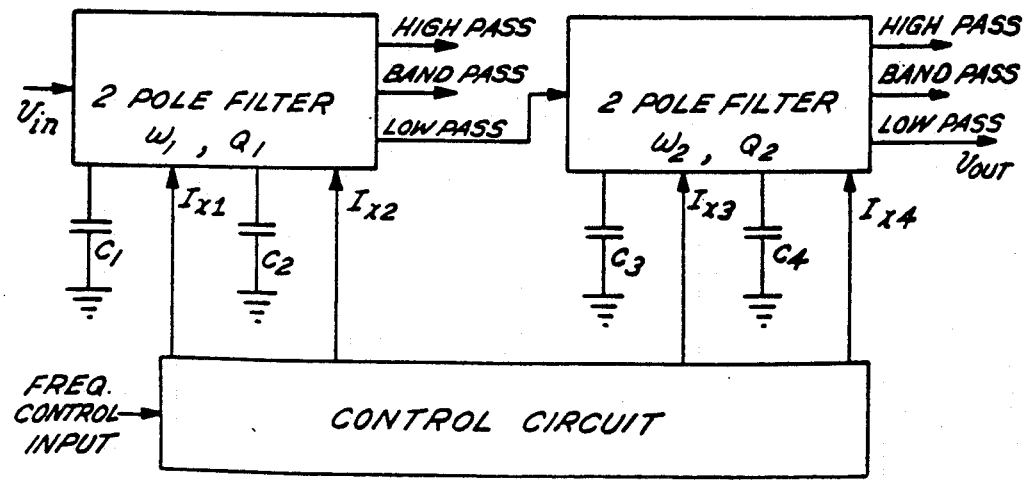
Figure 17:
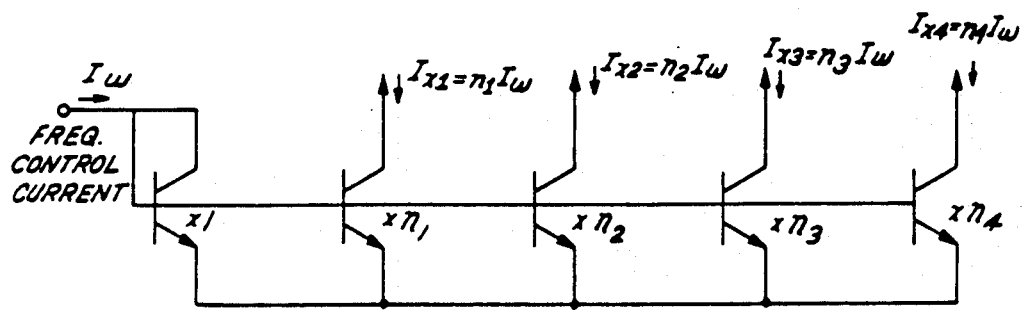
Figure 18:
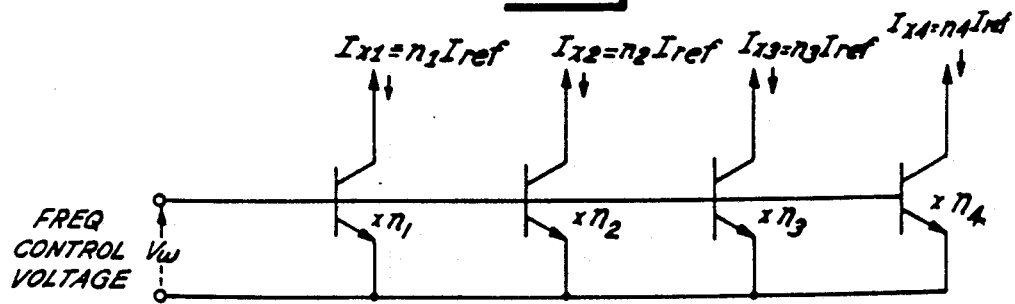
Figure 19:
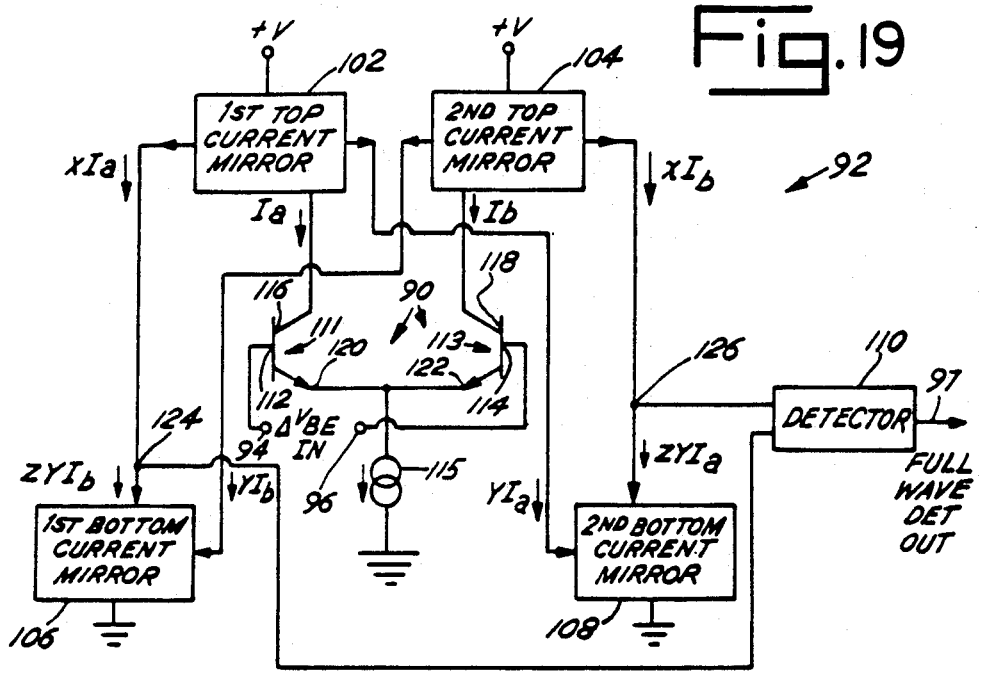
Figure 29:
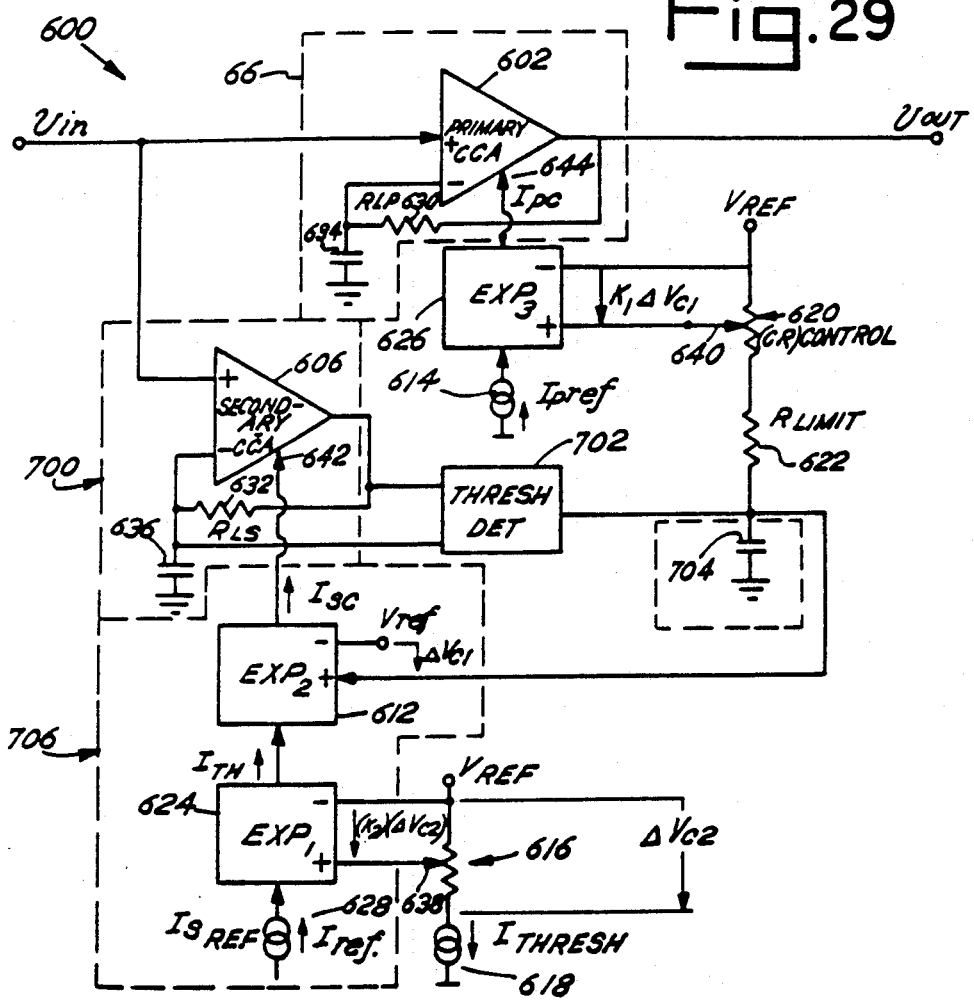

FIG. 3 is a schematic diagram of the bias current compensation circuit for the preferred embodiment shown in FIG. 1;

FIG. 4 is a block diagram of the input automatic gain control system for the preferred embodiment shown in FIG. 1; and FIG 5 is a graph demonstrating the effect of the automatic gain control system of FIG. 29.

DETAILED DESCRIPTION OF THE PREFERRED EMBODIMENTS

General System Description

Referring to FIGS. 1–5, the preferred embodiment of the present invention is shown as an improved hearing aid circuit, generally designated 20. Significantly, many of the circuits described herein may be used in a variety of different applications. However, the most preferred embodiment of the present invention relates to hearing aids. Thus, the invention has been described in the context of hearing aids.

As shown more clearly in FIG. 1, a hearing aid (not shown) includes a signal source or microphone 22, a "compander" 24, a filter or "tone control network" 26 and related external controls 28, an input Automatic Gain Control ("AGC") system 27 and related external controls 35, a main current controlled amplifier ("CCA") 32 and related external controls 34, an output signal processor 36 and related external controls 38, and a receiver or output transducer 40.

In several figures, dotted lines are drawn about selected circuit components. Such groupings of circuit components has been made somewhat arbitrarily and only as an aid to the reader is understanding the present invention.

As shown in FIGS. 1 and 2, the microphone 22 receives sound signals in the air and responsively transmits an electrical signal along a signal path 42, represented as heavy lines in FIGS. 1 and 2. Certain circuit components affect the electric signal indirectly, by affecting the operation of circuit components, rather than the actual signal itself. The signals from such components are sent via control paths, which are represented by the lighter lines 44 shown in FIGS 1 and 2.

Electrical signals generated by the microphone 22 have relatively small amplitude and are received by the compander 24. The compander 24 includes input current controlled amplifier 46, a "compand" detector 48, a "compand" filter 50, and an input current controlled amplifier control 52 to vary the gain of the current controlled amplifier 46.

The current controlled amplifier 46 simply increases the amplitude of the microphone signal in a predetermined manner for processing by the rest of the hearing aid circuit 20. The "compand" detector 48 senses when the output of the current controlled amplifier 46 exceeds a predetermined level, outside of the dynamic range of the filter 26.

When the "compand" detector 48 senses such a large signal from the current controlled amplifier 46, it sends a signal to "compand" filter 50. The "compand" filter 50 issues a smoothed compand detector signal, which is received by both the current controlled amplifier control 52 the main CCA control 68 and the secondary CCA control 706. The input current controlled amplifier control 52 then reduces a controlling current which it supplies to the input current controlled amplifier 46 to decrease the amount of amplification exerted by the amplifier 46.

The controlling current from the input current controlled amplifier control 52 is exponentially related to the amplitude of the signal received from the "compand" filter 50. The controlling current received by the main CCA 66 is inversely related to the controlling current to the input CCA 46. The gain of the main CCA 66 is thus inversely related to the gain of the input CCA 46. In this way, the gain through the system is constant, but the filters in the tone control network 26 operate over a narrower dynamic range of signal levels.

The output of the current controlled amplifier 46 is received by the tone control network 26. The tone control network 26 includes a four pole lowpass filter 54, which presents a signal to a four pole highpass filter 56. The two filters 54, 56 are controlled, respectively, by the potentiometers, or controls 58, 60. The settings of the potentiometers 58, 60 determine the frequency at which the low pass and high pass filters 54, 56 will start substantially influencing the signal received.

A signal from the lowpass and highpass filters 54, 56 is transferred to the variable slope filter 62, which further shapes the frequency spectrum of the signal. The variable slope filter 62 presents two signals to a variable slope control 64, which may be adjusted to further attenuate high frequency signals, low frequency signals, or to pass all frequencies equally.

The variable slope control 64 provides a signal to the input AGC circuit 27 and the main amplifier 32. The main amplifier 32 includes the main current controlled amplifier 66 and the main current controlled amplifier control 68. Two external adjustments, a user operated volume control 70 and a full on gain control 72, are interconnected to the main current controlled amplifier control 68. Control 68 also receives inputs from the compander 24, the output signal processor 36, and the input AGC system 27, which are used to control the gain of the main current controlled amplifier 66.

Thus, when the compander 24 is operating, it sends a signal to the main current controlled amplifier control 68 so that the input to the main amplifier 32 is expanded to the same degree that it was compressed by the input current controlled amplifier 46.

The level of gain that the main current controlled amplifier 66 exhibits is determined, in part, by the inputs to the control 68, including the setting of the user operated volume control 70. The maximum gain obtainable with the user operated volume control 70 full on is established in part by the setting of the full on gain control 72.

The input AGC system 27 includes a secondary CCA 700, an AGC Detector 702, AGC filter 704, secondary CCA control 706, and associated external controls 35 including the AGC threshold control 710 and AGC CR (compression ratio control) 712. In addition the system uses portions of the main amplifier 32, including the main CCA 66 and a portion of the main CCA control 68.

The input AGC system uses a feedback system to establish the control signal, and this control signal is fed forward to the main CCA 66. The secondary CCA 700 amplifies the signal from the variable slope control 64 and sends this amplified signal to the AGC detector 702. The AGC detector 702 senses when the output of the secondary CCA 700 exceeds a predetermined level, called the AGC detector threshold level.

When the AGC detector 702 is triggered by an input reaching or exceeding the threshold level, it sends a signal to the AGC filter 704 which issues a smoothed AGC detector signal (called $V_{c1}$), which is received by the secondary CCA control 706. The secondary CCA control 706 supplies a control current to the secondary CCA 700 to control its gain. This control current is controlled by both the smoothed detector signal ($V_{c1}$) and an external control, the AGC threshold control 710. The detector signal ($V_{c1}$) causes the control current to be reduced, which reduces the gain of the secondary CCA 700 such that its output signal amplitude does not substantially exceed the AGC detector threshold level.

The signal level form the microphone required to trigger the AGC detector 702 is called the input AGC threshold. The AGC threshold control 710 also varies the gain of the secondary CCA 700 so as to vary the input AGC threshold.

The secondary CCA control 706 also receives an inverse controlling signal from the compand filter 50 to expand the previously compressed signal which is present at the variable slope control 64 output. In this way the compansion action will not influence the detector signal $V_{c1}$ and the compander will not be "seen" by the input AGC system.

If this smoothed detector signal ($V_{c1}$) is applied to the main CCA control 68, the result would be an AGC system with a very high non-variable compression ratio (CR) above the AGC threshold. To provide variable slope compression, the detector signal ($V_{c1}$) from the AGC filter 704 is passed through a variable control, the AGC CR control 712. The AGC CR control 712 can provide an adjustable portion of the detector signal to the main CCA control 68, which controls the gain of main CCA 66. Thus, for input levels above the AGC threshold, the amount of gain reduction which the input AGC system exerts on main CCA 66 is variable by means of the AGC CR control 712, thereby varying the slope of the input-output curve above the threshold.

The output of the main current controlled amplifier 66 is received by the output signal processor 36. The output signal processor 36 includes a clipper 74, output amplifier 76, output current detector 78, voltage output detector 80, AGC detector 86, internal automatic gain control switch 82, and AGC filter 84. An external AGC switch 88 and a power level control 90 are interconnected to the output signal processor 36.

The clipper 74 prevents any signal received form the main current controlled amplifier 66 from exceeding a certain predetermined output level set by the power level control 90. The output of the clipper 74 is sent to the output amplifier 76, and a secondary output is sensed by the automatic gain control detector 86.

The output amplifier 76 further increases the signal received from the clipper 74, before it is sent to the receiver 40. Current and voltage detectors 78, 80 sense the output current and voltage and provide output signals to the AGC switch 82 when either the output current or the output voltage exceeds a respective predetermined level.

The automatic gain control switch 82 may be switched on with the external AGC switch 88. Signals from the current and/or voltage detectors 78, 80, or from the automatic gain control detector 86 signify that the output of the circuit 20 is too large. Such signals are thus transmitted to the automatic gain control filter 84, which smooths and combines these signals and feeds them back to the main current controlled amplifier control 68 to reduce the amount of gain which the main current controlled amplifier 66 is then providing.

A signal from the output amplifier 76 is applied to the receiver 40, which converts the electrical signal to sound. This sound is then heard by the wearer of the hearing aid.

System Architecture

Much of the advantages of the present system arise from the architecture or placement of the various components. In particular, a compression circuit and an expansion circuit are placed on opposite sides of the voltage controlled filters to increase the dynamic range of the system. Moreover, the adjustable peak clipping circuit or clipper 74 is positioned before the fixed gain output stage or output amp 76. As a result, the previously mentioned design problems of providing adjustable clipping at the output of the output stage, such as asymmetrical clipping and sensitivity to output stage bias current, are avoided.

In addition, the adjustable output automatic gain control circuit is located before the fixed gain output stage. As a result, the output automatic gain control may be connected to the clipper 74 to allow the power level control 90 to determine the output limiting level in both AGC and non-AGC modes. In addition, the auxiliary automatic gain control uses both output voltage and output current detection systems 80, 78 at the output stage.

By adding a fixed amplitude detection system at the output of the output stage, a greater undistorted maximum output level from the output stage during use of the output automatic gain control may be safely designed for. This is because the tolerances of the detection level occuring at the input of the output stage as well as the output stage gain do not require that the detection level be set lower to prevent possible clipping in the output stage when the output level control is set to maximum. Instead, the detection level may be set high enough to substantially guarantee full use of the output amplifier's amplitude capability and the fixed amplitude detection at the output of the output stage will override the detection at the input of the output stage when the output level control is set to maximum.

The output voltage detection simply triggers the output automatic gain control if the collector to emitter voltage of the output stage transistors nears saturation, thus preventing clipping and resultant distortion.

The output current detection monitors the current delivered to the receiver and also triggers the output automatic gain control if a predetermined current limit is exceeded. This has a major advantage in the preferred embodiment which is a high power hearing aid. The current state of the art in receiver design produces receivers with widely fluctuating impedance versus frequency which, at some frequencies, can drop very low compared to the average impedance value. When driven by an amplifier capable of driving the receiver to maximum levels where the receiver exhibits nominal impedance, the receiver may draw excessive current from the amplifier at frequencies where receiver impedance is much lower, either exceeding the receiver's own current limits for low distortion operation or possibly the amplifier's linear operation region, which could also increase distortion. Thus, having both current and voltage detection utilizes the maximum output capability of the amplifier-receiver system across the frequency range of the system.

In addition, the input automatic gain control circuit uses independent adjustment of the compression threshold and compression ratio and allows for precise adjustment of each of these factors without interaction between the adjustments.

In addition, level detection for the input automatic gain control circuit is located after the tone (or frequency shaping) control 26, but still before the gain control. Applicants have found that such an arrangement provides a more desired signal, since the AGC system is operating on the signal eventually supplied to the receiver and "heard" by the wearer of the aid 20. In other arrangements, the AGC system may operate on signals not yet shaped by the filter, or tone control.

Normally, it is desired that selected frequencies of sound signals not passed by the filter, and thus not intended to be amplified by the aid, should not affect the operation of the aid. Since the AGC system of the present invention does not operate on such signals, since they may be effectively attenuated by the filter, such extraneous noise will not significantly influence the operation of the AGC system.

Thus, for example, the filter may be adjusted such that low frequency signals, such as the low frequency sounds emitted by heavy machinery, will be substantially attenuated by the filter. If the AGC level detection occurs before the filter, these signals could cause the AGC system to respond and reduce the gain for higher frequency desired signals. However, the present AGC would not respond to these low frequency signals when they are outside of the filter pass band.

Moreover, the main current controlled amplifier uses a control signal which is a composite of signals. The composite of signals is derived from a plurality of inputs from different sections of the aid. The signal is comprised of the signal from the compander 24, the input AGC system 27, the output signal processor 36, the user-operated volume control 70, and the full-on gain control 72. By using such a composite of signals, a single current controlled amplifier 66, rather than a series of amplifiers, may be used. This reduces the noise generated and complexity of the circuit, as well as allowing the circuit to be made more cheaply.

The hearing aid circuit 20 is comprised of different, smaller circuits. Several of these smaller circuits for the overall hearing aid circuit 20 are individually discussed in detail in separate sections below:

Base Bias Current Compensation Circuit (within, e.g., the Input Current Controlled Amplifier 46 and Main Current Controlled Amplifier 66)

Figure 28:
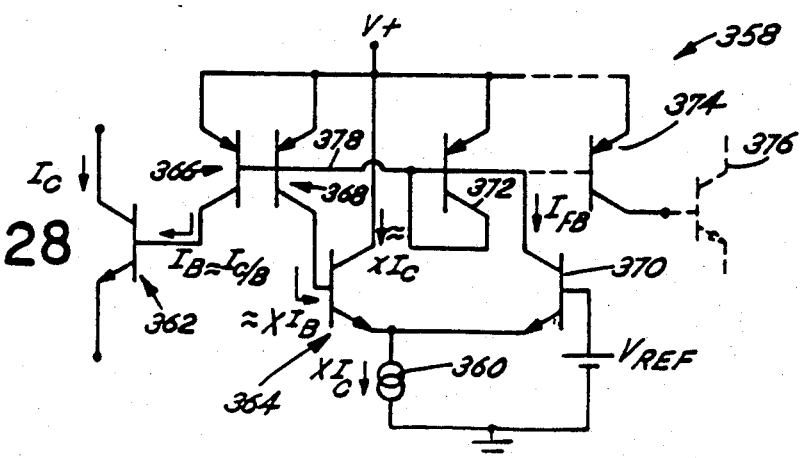

It is often necessary to reduce the loading effect which the base bias current of a transistor has upon the circuit which drives the base of the transistor. As shown in FIG. 28, a base bias current compensator 358 supplies approximately the base bias current requirements of a reference transistor 362 which would otherwise have to be supplied by the other circuitry associated with the base of the reference transistor. The reference transistor is carrying an approximately known reference current ($I_c$) through its collector and has a beta (or current gain) which is known to track or match well with another transistor. This is usually the case in a given integrated circuit.

As shown in FIG. 28, the compensator 358 includes a current source 360 and a reference transistor 362, as well as a sampling transistor 364, first and second mirror transistors 368, 366 and feedback transistor 370. The most preferred embodiment also includes a diode connected transistor 372, an additional mirror transistor 374, and an additional reference transistor 376.

In the preferred embodiment, the transistors all are formed on the same integrated circuit chip. Thus, the emitter areas, current gain characteristics, and the tansconductance characteristics of the NPN transistors may be fairly substantially controlled so that they bear a predetermined relation toward each other. The same holds true for PNP transistors, although the relationship between NPN and PNP characteristics is not well determined.

The reference transistor 362 handles a substantially known collector to emitter reference current, now designated $I_c$ in FIG. 28. A base current of $I_b$, which is equal to $I_c/B_{ref}$ (where $B_{ref}$ is the current gain of transistor 362), must be provided to the reference transistor 362 so as to substantially cancel the bias current that would be otherwise supplied by other circuitry associated with the base of transistor 362.

The current source 360 provides a current in a substantially known ratio to the reference current, now designated (X) ($I_c$). The current source 360 supplies most of its current to the sampling transistor 364 (which has a beta approximately equal to $B_{ref}$). The current supplies to the base of the sampling transistor 364 is approximately equal to (X) ($I_B$) (assuming that transistors 362 and 364 have approximately equal current gain). Current supplies to the base of the sampling transistor 364 is supplied by the collector of the first mirror transistor 368.

The feedback transistor 370 (interconnected as shown in FIG. 28) substantially forms a differential pair with the sampling transistor 364 and serves to adjust the collector current of the first mirror transistor 368 so as to regulate the collector current of the sampling transistor 364 to be approximately equal to XIc minus the collector current ($I_{FB}$) of feedback transistor 370. The base of transistor 370 is biased by a reference voltage $V_{ref}$ as shown in FIG. 28.

The diode connected transistor 372 which is in parallel with the base-emitter junction of first mirror transistor 368 is included in the preferred embodiment in order to reduce the effect of PNP beta (current gain) variation on $I_{FB}$. For the embodiment shown, $I_{FB}$ is approximately equal to $XI_B$. Therefore, since $XI_c/XI_B$ is approximately the current gain of the sampling transistor 364, the current source 360 will supply $$XI_c - \frac{XI_c}{B}$$

or $XI_c$ (1 − 1/B) to the sampling transistor 364. For typical betas, (1 − 1/B) can be very close to unity.

The second mirror transistor 366 has its base and emitter interconnected respectively to the base and emitter of the first mirror transistor 368. By scaling the emitter areas of the first and second mirror transistors 368, 366 the current through the second mirror transistor 366 may be set to be in a predetermined ratio to the current through the collector of the first mirror transistor 368. This predetermined ratio may be set equal to 1/X. Since the current through the collector of the first mirror transistor 368 approximately equals (X) ($I_B$), the current through the collector of the second mirror transistor 366 approximately equals (X) ($I_B$) divided by X or $I_B$, which is approximately the desired base current for the reference transistor 362.

One or more additional mirror transistors (such as the transistor 374) may have its base-emitter junction placed in parallel with the base-emitter junction of the first and second mirror transistors 368, 366. Thus, additional reference transistors, such as the transistor 376, may have their base current requirements supplied as well.

By varying the ratio X and the ratios of the emitter areas of the mirror transistors, base compensation currents of arbitrary ratios are possible. The present application provides a very wide variety of applications where approximate cancellation of or compensation for base currents is required. Moreover, the compensator 358 operates at a very low supply voltage, such as one volt.

INPUT AUTOMATIC GAIN CONTROL SYSTEM 600

A more detailed diagram of the input Automatic Gain Control ("AGC") system 600 is shown in FIG. 29. Certain circuit elements from FIG. 2 have been redrawn and renumbered in FIG. 29 as an aid for instruction.

The primary signal path is through the primary Current Controlled Amplifier ("CCA") 602. The primary CCA 602 is loaded by resistor $R_{LP}$ 630 and has full DC feedback taken from the junction of $R_{LP}$ 630 and capacitor 634. The capacitor 634 effectively bypasses AC feedback, providing substantially open loop AC operation.

Figure 23:
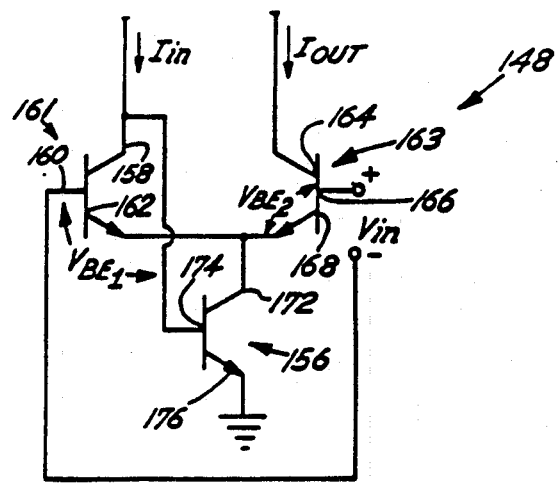
Figure 24A:
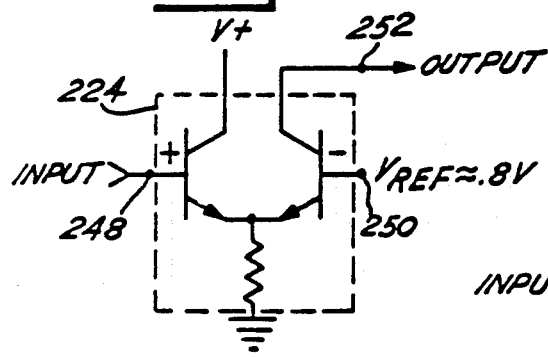
Figure 24B:
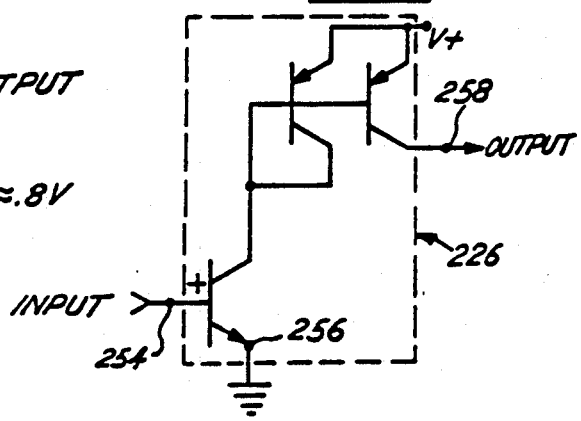
Figure 25:
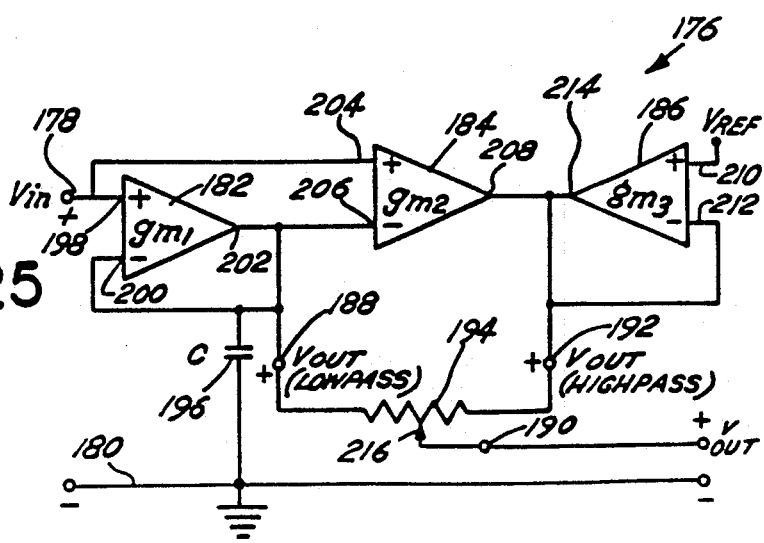
Figure 24:
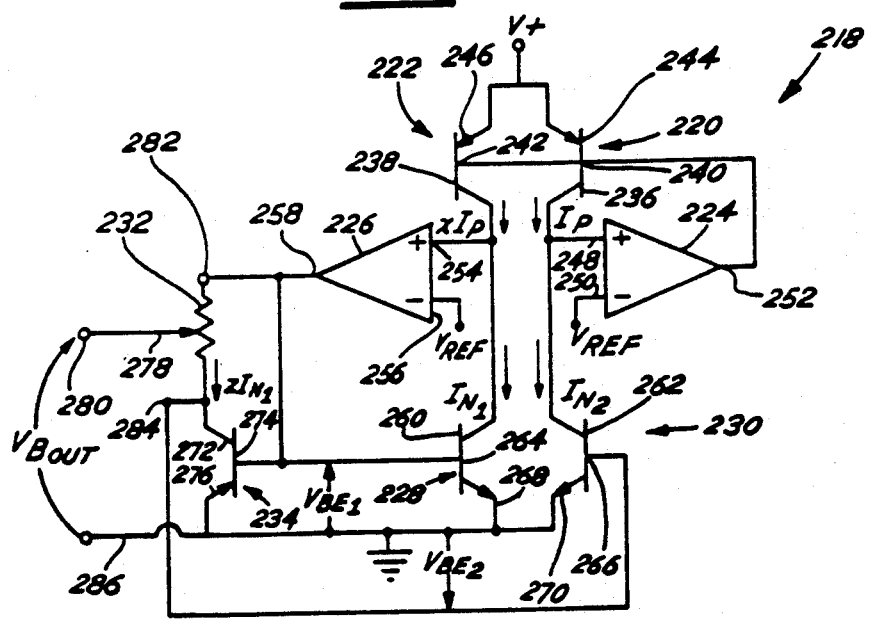
Figure 26:
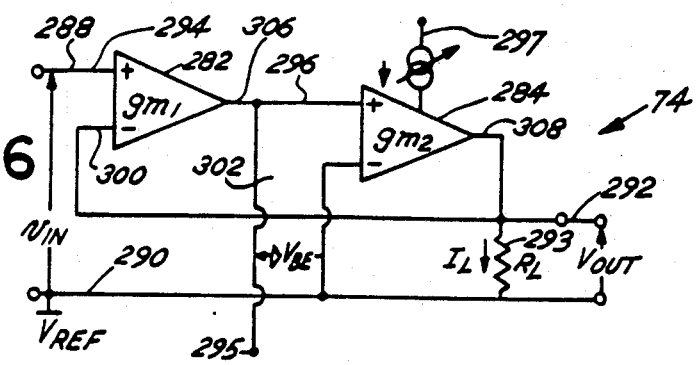
Figure 27:
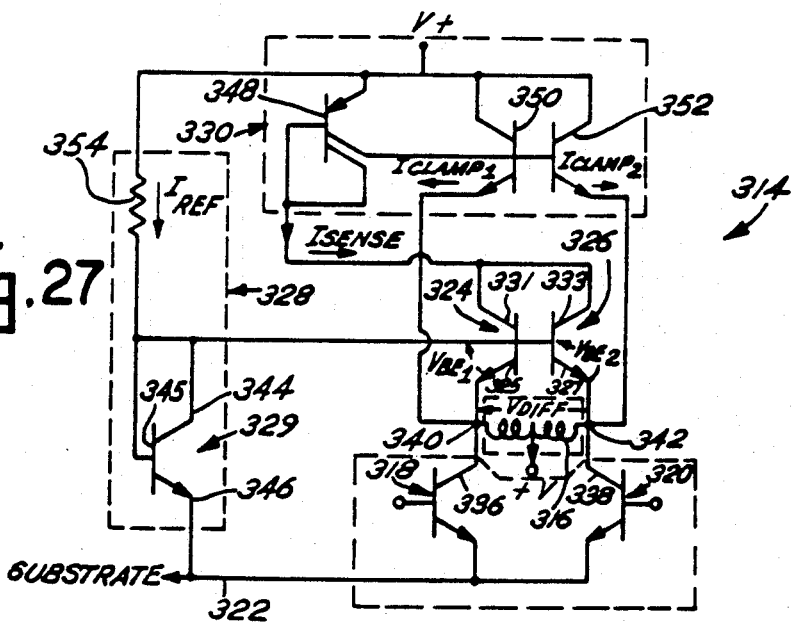

Components 602, 630, 634 are contained in FIG. 2 as the main CCA 66. The balance of the circuit, shown in dotted lines 604, develops the primary control current ($I_{pc}$) for the primary CCA 602. The differential voltage controlled exponential current sources 612, 624, 626, designated Exp in FIG. 29, is shown in FIG. 23 and, as previously discussed, provides an output current ($I_{out}$) related to an input current ($I_{in}$) and control voltage ($V_c$) according to the following equation:

$$I_{out} = I_{in} \left[ \exp\left(\frac{\Delta V_c}{V_T}\right) \right] x$$

where x is the emitter area ratio previously discussed, and $V_c = V_{be2} - V_{be1}$.

Figure 22:
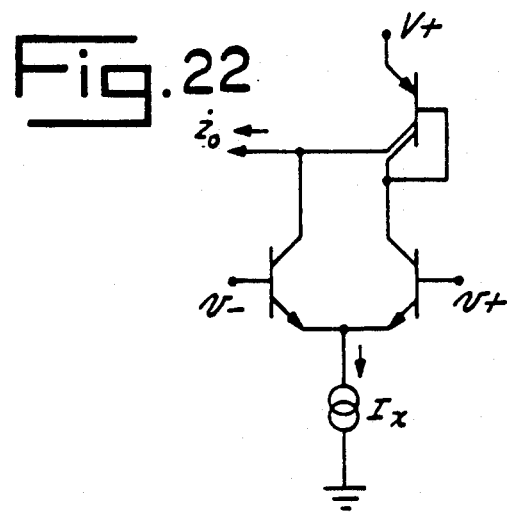

The current controlled amplifiers 602, 606 are operational transconductance amplifiers (OTAs), as previously discussed and shown in FIG. 22. The secondary CCA 606 is loaded by resistor $R_{LS}$ 632 and has full DC feedback taken from the junction of $R_{LS}$ 632 and capacitor 636. The capacitor 636 effectively bypasses AC feedback, providing substantially open loop AC operation. Components 606, 632, 636 are contained in FIG. 2 as the secondary CCA 700.

Figure 20:
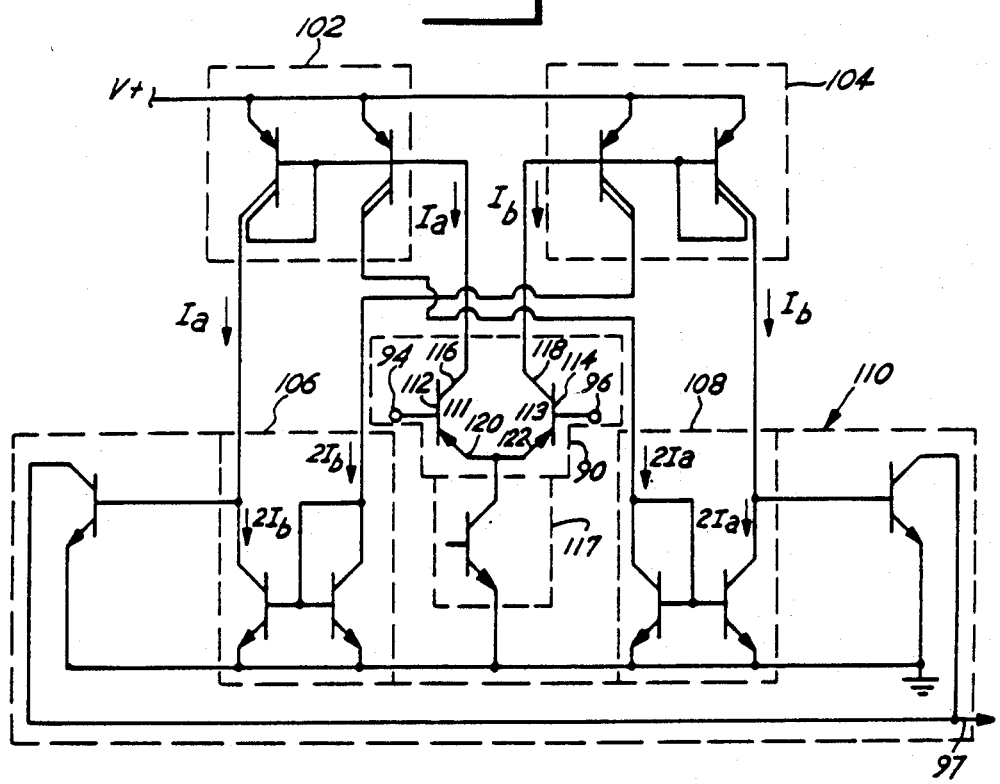

The input signal ($V_{in}$) (which in FIG. 2 comes from the variable slope control 64) is also amplified by the secondary CCA 606 whose output voltage developed across $R_{LS}$ 632 is applied to a threshold detector 702 consisting of the detector circuit shown in FIG. 20. The output of detector 702 is smoothed by the AGC filter capacitor 704 to develop a control signal $V_{c1}$.

The control signal, which is developed and measured with respect to a voltage reference $V_{ref}$, is fed back, via the exponential current source 612, as a secondary control current ($I_{sc}$) for the secondary CCA 606. If the input signal level is very low, then even when amplified by the secondary CCA 606, the signal level will be below the threshold of the threshold detector 608 and the control signal $\Delta V_{c1}$ will be zero.

Under this circumstance, the voltage across AGC filter capacitor 704 is kept at approximately $V_{ref}$ by the series resistor string made up of $R_{limit}$ 622 and the compression ratio control (CR) 620, interconnected between the output of the detector 702 and $V_{ref}$.

The gain $A_2$ of the secondary CCA 606 is determined by the current ($I_{sc}$) applied to its gain control input 642. The gain $A_s$ when $\Delta V_{c1} = 0$ is defined as $A_{so}$.

The current out of Exp$_1$ 624 ($I_{th}$) (which is the input current to Exp$_2$) is:

$$I_{th} = [I_{sref}x_1]\left[\exp\left(\frac{k_2\Delta V_{c2}}{V_T}\right)\right]$$

where $k_2 V_{c2}$ is the voltage at the wiper arm 638 of potentiometer 616, having a total resistance $R_{thresh}$ whose end terminals are interconnected to $V_{ref}$ and fixed current source 618 having a value $I_{thresh}$. Therefore $k_2 \Delta V_{c2}$ may be varied by potentiometer 616 from zero volts to $V_{c2} = I_{thresh}$ times $R_{thresh}$ (as $K_2$ is varied from 1 to 1). $X_1$ is the emitter area ratio constant for current source Exp$_1$ 624, and $I_{sref}$ is supplied by fixed current source 628.

The current out of Exp$_2$ 612 ($I_{sc}$) (which is the control current for the secondary CCA 606) is:

$$I_{sc} = [I_{th}][x_2]\exp\left(\frac{\Delta V_{c1}}{V_T}\right)$$

where $x_2$ is the emitter area ratio constant for current source Exp$_2$ 612. Thus $$I_{sc} = I_{sref}(x_1)(x_2)\left[\exp\left(\frac{\Delta V_{c1} + k_2\Delta V_{c2}}{V_T}\right)\right]$$

Thus, when $\Delta V_{c1}$ is zero (signal level below the AGC threshold), $$I_{sc} = [I_{sref}(x_1)(x_2)]\left[\exp\left(\frac{\Delta V_{c2}}{V_T}\right)\right]$$

and varying the setting of the threshold control 616 varies the gain $A_{so}$ of the secondary CCA and thus the amplitude of $V_{in}$ required to trigger the threshold detector.

The threshold $V_{th}$ of the threshold detector 702 is reached when $A_{so} V_{in} = V_{th}$. This occurs when $$V_{in} = \left[\frac{V_{th}}{A_{so}}\right]\left[\frac{1}{\exp\left(\frac{K_2\Delta V_{c2}}{V_T}\right)}\right]$$

Accordingly, the threshold is adjusted in an exponential manner by $K_2$, the setting of the threshold control 616.

When the threshold is exceeded the threshold detector 702 discharges filter capacitor 704 and $V_{c1}$ decreases from zero, decreasing the gain ($A_s$) of the secondary CCA 606. This forms a feedback system, and with high loop gain, the system will keep the output of the secondary CCA 606 very close the detector threshold $V_{th}$. Then, for input levels above the threshold point, $$A_s(V_{in}) = [A_{so}(V_{in})]\left[\exp\left(\frac{\Delta V_{c1}}{V_T}\right)\right] \approx V_{th}.$$

An adjustable portion ($K_1\Delta V_{c1}$) of the control signal $\Delta V_{c1}$ taken from the wiper arm 640 of the compression ratio control (potentiometer) 620 is used as a feedforward signal to control the gain of the primary CCA 602. $K_1$ varies from 0 to 1 (or to some other preselected limit less than 1 determined by $R_{limit}$ 622) by adjustment of the control 620. $K_1\Delta V_{c1}$ is applied to the voltage inputs of current source Exp$_3$ 626 and $I_{pref}$ from fixed current source 614 is the current input to Exp$_3$. The output current from Exp$_3$, designated $I_{pc}$ (which is applied to the gain control terminal 644 of the primary CCA 602) is given by:

$$I_{pc} = [I_{pref}(X_3)]\left[\exp\left(\frac{K_1\Delta V_{c1}}{V_T}\right)\right]$$

where $x_3$ is the emitter area ratio constant for current source Exp$_3$ 626.

The gain $A_p$ of the primary CCA 602 is given by $$A_p = [(A_{po})][\exp(K_1\Delta V_{c1}/V_T)]$$

Below the threshold, $V_{c1} = 0$ and the CCA 602 has a fixed gain $A_{po}$. Above the threshold, the gain is given by:

$$A_p = A_{po}\left[\exp\left(\frac{\Delta V_{c1}}{V_T}\right)\right]^{K1} = (A_{po})[V_{th}/(V_{in}A_{so})]^{K1}$$

The output signal is $V_{out} = (A_{po})(V_{in})$. Expressed in decibels, where L is the amplitude in (dB) and G is the gain in (dB), $L_{in} = 20 \log (V_{in})$; $L_{out} = 20 \log (V_{out})$, and $G_{po} = 20 \log (A_{po})$. Below threshold, $L_{out} = L_{in} + G_{po}$. Above threshold, $$L_{out} = G_{po} + L_{inth} + (1 - K_1)(L_{in} - L_{inth})$$

where $L_{inth}$ is the input level corresponding to threshold and is given by $$L_{inth} = 20 \log(V_{th}/A_{so}) = 20 \log\left\{ V_{in}\left[ \exp\left(\frac{K_2 \Delta V_{c2}}{V_T}\right)\right]\right\}$$

Figure 30:
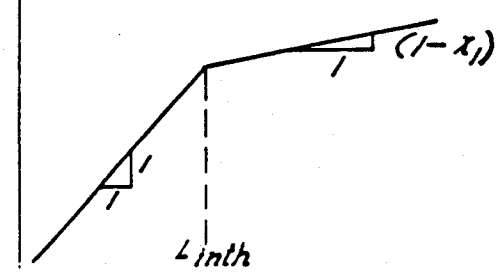

These characteristics are illustrated in the output versus input curve shown in FIG. 30.

Also, in the preferred embodiment, the base bias compensation circuits, as shown in FIG. 28 and previously discussed, are interconnected to the positive and negative inputs of the primary and secondary CCA's 602, 606 and substantially supply their input base current requirements. This reduces feedthru of the gain control currents $I_{pc}$, $I_{sc}$ into the signal paths of the CCAs. Such feedthru may cause undesirable clicks and thumps in the signal as well as cause transient signal amplitude aberrations during the attack and decay periods of AGC operation.

Figure 21:
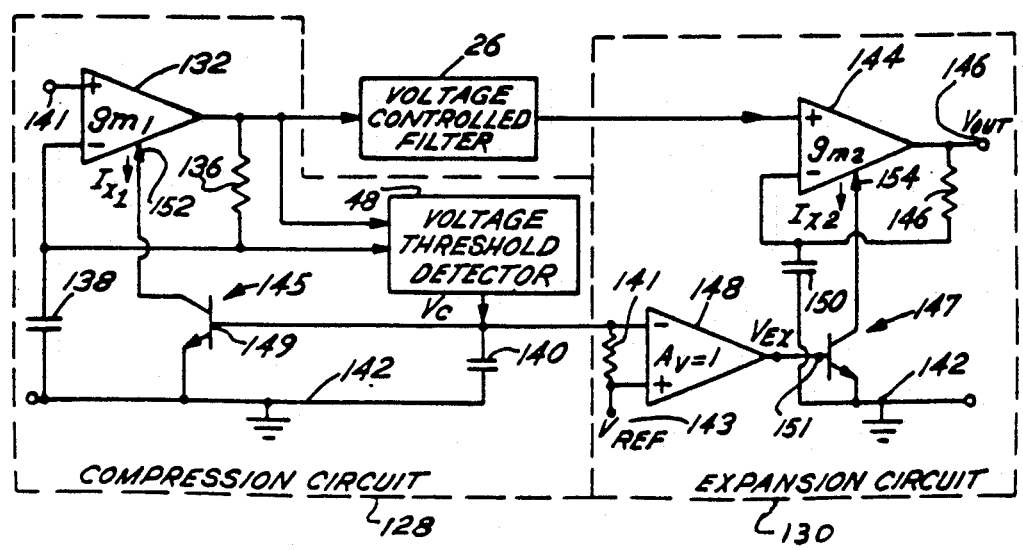

In addition, in the preferred embodiment, the compand control voltage ($V_c$ in FIG. 21) is applied to the negative input of Exp2(612) in place of $V_{ref}$ to complete the companison system and provide a linear input/output relationship between microphone output 22 and detector 702 input.

A variety of preferred embodiments of the present invention have been described herein. It is to be understood, of course, that changes and modifications may be made in embodiments without departing from the true scope and spirit of the present invention, as defined by the appended claims.

What is claimed is:

1. A base bias current compensator to substantially supply base current requirements of a reference transistor which would otherwise have to be supplied by the associated circuitry, said reference transistor having a particular polarity and operating at a predetermined collector current and having a base, and having a reference current gain characteristic, comprising, in combination:

a current source for substantially supplying a current in a ratio to said predetermined collector current;

a first transistor, of same polarity as said reference transistor, having a first transistor emitter interconnected to said current source, substantially receiving said current in a ratio to said predetermined collector current, and having a current gain characteristic related to said reference current gain characteristic and having a first transistor base substantially drawing a predetermined fraction of said predetermined collector current;

a second transistor, of opposing polarity to said reference transistor, having a second transistor collector interconnected to said base of said first transistor for supplying a second collector current to said first transistor base, said second transistor having a second predetermined transconductance characteristic, and a second transistor base and emitter; and a third transistor, of same polarity as said second transistor, having a third transistor collector interconnected to said base of said reference transistor, for substantially supplying a predetermined base current to said base of said reference transistor, said third transistor including a base and an emitter interconnected, respectively, to said base and said emitter of said second transistor, said third transistor having a third predetermined transconductance characteristic being in a substantially predetermined ratio to said second transconductance characteristic, whereby a third collector current is provided to said base of said reference transistor which is in a predetermined ratio to said second collector current; and a feedback amplifier having an input interconnected to said first transistor emitter and an output interconnected to said bases of said second and third transistors, whereby said second collector current may be adjusted to provide said predetermined fraction of said predetermined collector current to said base of said first transistor, and whereby said third collector current is provided to said base of said reference transistor substantially in an amount required for said reference transistor to provide said predetermined collector current.

2. A base bias current compensator as claimed in claim 1 further comprising at least one additional regulatory transistor and reference transistor, said additional reference transistor being of same polarity as said reference transistor and operating at an additional predetermined collector current, and having a base, and having an additional reference current gain characteristic being in a substantially predetermined ratio to said reference current gain characteristic, said additional regulatory transistor being of same polarity as said second transistor and having a collector substantially supplying an additional predetermined base current to said base of said additional reference transistor, said additional regulatory transistor including a base and emitter interconnected respectively to said bases and said emitters of said second and third transistors, said additional regulatory transistor having an additional predetermined transconductance characteristic which is in an additional predetermined ratio to said second transconductance characteristic.

3. A base bias current compensator as claimed in claim 1 wherein said feedback amplifier means includes a fourth transistor, of same polarity as said first transistor, having a fourth transistor emitter and collector respectively interconnected to said first transistor emitter and said second transistor base; and a biasing source interconnected to fourth transistor base.

4. A base bias current compensator as claimed in claim 1 additionally comprising a fifth transistor, of same polarity as said second transistor, having fifth transistor base and collector both interconnected to said second transistor base, and fifth transistor emitter interconnected to said second transistor emitter, whereby said third collector current is less influenced by variation in current gain characteristics of said second and third transistors.

* * * * *